(12) United States Patent
Stark et al.

(10) Patent No.: US 6,291,261 B1
(45) Date of Patent: Sep. 18, 2001

(54) METHOD AND DEVICE FOR PROCESSING A FLAT WORKPIECE, ESPECIALLY A SEMICONDUCTOR WAFER

(75) Inventors: Kurt Stark, Berg; Markus Keller, Sulgen, both of (CH)

(73) Assignee: Alphasem AG, Berg (CH)

( * ) Notice: Subject to any disclaimer, the term of this patent is extended or adjusted under 35 U.S.C. 154(b) by 0 days.

(21) Appl. No.: 09/508,768
(22) PCT Filed: Jun. 14, 1999
(86) PCT No.: PCT/CH99/00257
  § 371 Date: Apr. 18, 2000
  § 102(e) Date: Apr. 18, 2000
(87) PCT Pub. No.: WO00/05772
  PCT Pub. Date: Feb. 3, 2000

(30) Foreign Application Priority Data

Jul. 20, 1998 (EP) .................................................. 98810697

(51) Int. Cl.$^7$ .................................................. H01L 21/44
(52) U.S. Cl. ...................... 438/106; 438/150; 438/250; 427/283; 437/133; 451/49
(58) Field of Search ...................... 438/106, 150, 438/250; 437/133, 283; 451/49

(56) References Cited

U.S. PATENT DOCUMENTS

| | | | |
|---|---|---|---|
| 5,385,865 | * | 1/1995 | Nieder et al. .................. 437/133 |
| 5,674,111 | * | 10/1997 | Harada et al. .................. 451/49 |
| 5,863,609 | * | 1/1999 | Yamamoto .................. 427/283 |

FOREIGN PATENT DOCUMENTS 2 749 794   12/1997   (FR) .

\* cited by examiner

Primary Examiner—Richard Elms
Assistant Examiner—Pho Luu
(74) Attorney, Agent, or Firm—Shoemaker and Mattare, Ltd.

(57) ABSTRACT

Semiconductor wafers are glued onto a carrier foil which is stretched across a frame. Instead of restretching the carrier foil directly at a processing machine, the foil is restretched on an adapter frame which can be stored and then later manipulated in the processing machine. The adapter frame includes a clamping ring, a base ring, and a threaded ring which secures the carrier foil.

18 Claims, 10 Drawing Sheets

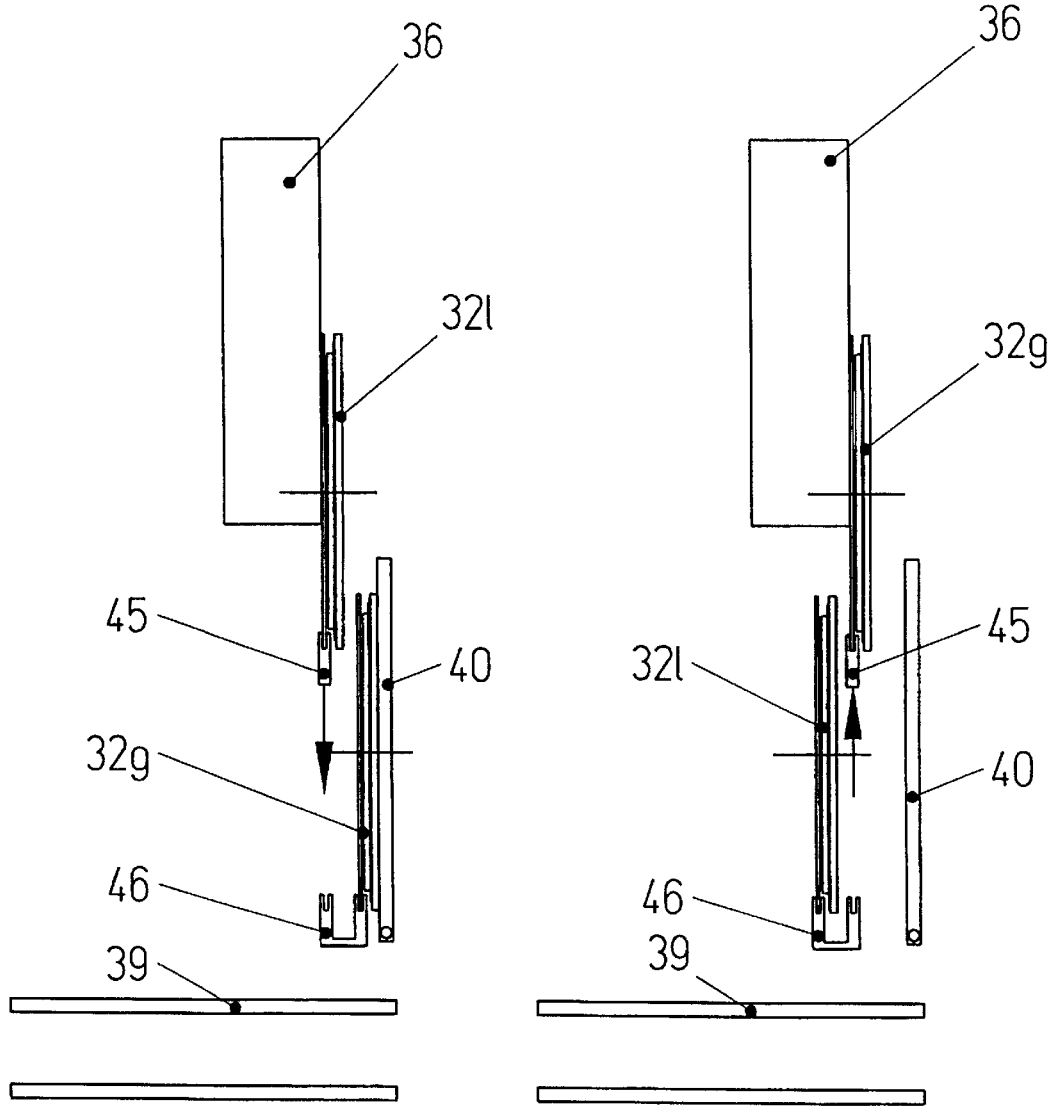

Figure 1:
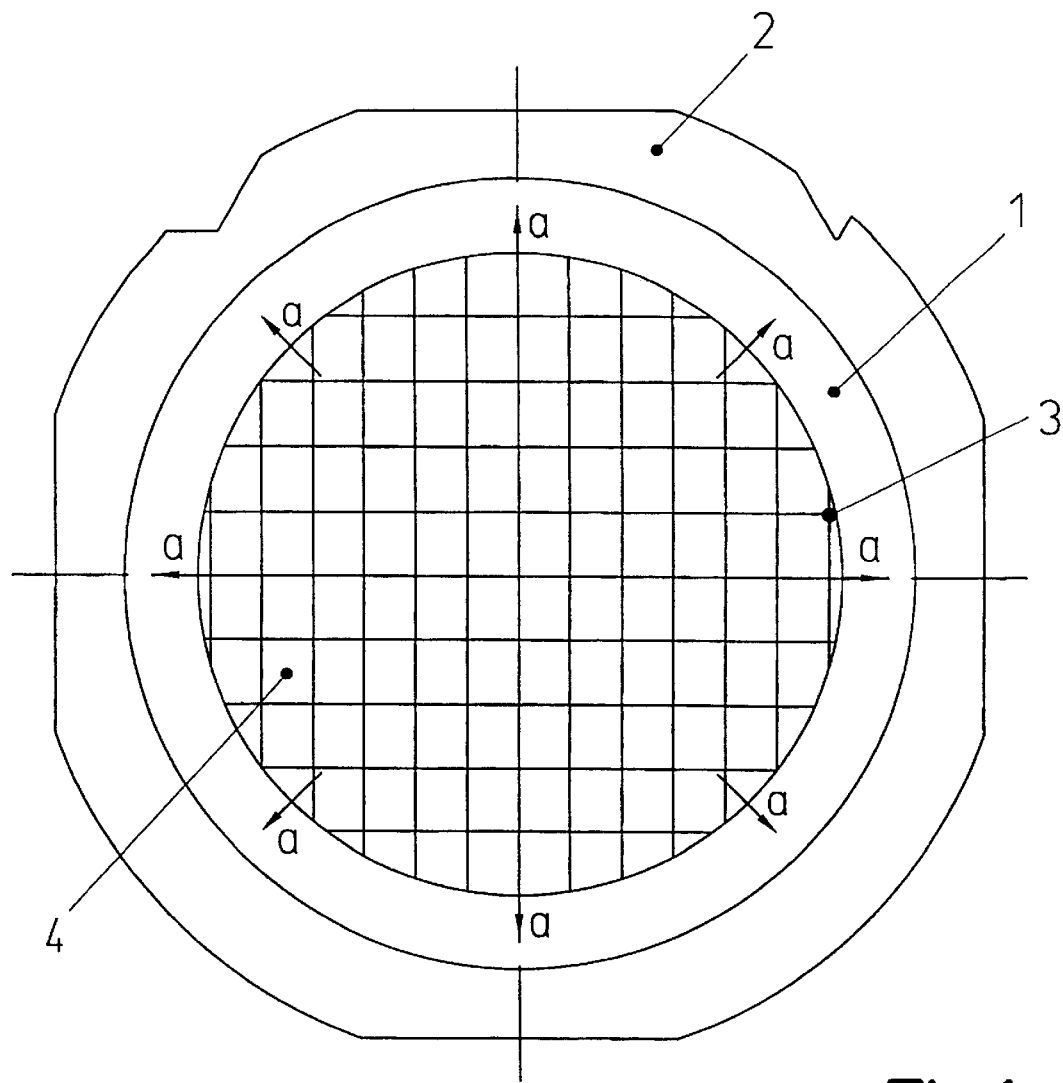

METHOD AND DEVICE FOR PROCESSING A FLAT WORKPIECE, ESPECIALLY A SEMICONDUCTOR WAFER

The invention relates to a method for treating a two-dimensional subject, in particular a semiconductor wafer, according to the preamble of claim 1.

So that for example chips premanufactured on a silicon wafer may be sawn off in a sawing device or may be processed in a chip assembly automatic machine, the wafer must be exactly positioned and be adhesed to a carrier foil in a manner free of bubbles. The foil is at the same time tensioned on an annular foil frame, a so-called waferframe. In this manner the very thin and fragile wafers may be easily stored, transported and processed. For an exact removal of the chips from the adhesing foil in equipping automatic machines (die bonders), the carrier foil must be tensioned afterwards, wherein a slight expansion of the wafer is obtained. With this there arise intermediate spaces between the individual chips which simplifies the removal.

The post-tensioning of the carrier foil with known methods is effected directly in the processing device, thus for example on the receiving table of the equipping automatic machine. For this for example a tensioning ring is pressed against the carrier foil which may roughly be compared to the tensioning of a drum. Also vacuum devices are known with which the carrier foil under a vacuum is suctioned into a circumferential groove and by way of this is tensioned (U.S. Pat. No. 4,744,550).

A disadvantage of the known methods lies however in the fact that the foil frame is not standardised, and that the post-tensioning device in each case must always be adapted to the corresponding frame. This requires to some extent expensive machine conversions. Furthermore it has been shown that with the ever increasing diameter of the semiconductor wafers and thus of the foil frame there occurs a sagging of the carrier foil which may no longer be tolerated. With the handling of the foil frames with this for example individual chips may knock against one another at the edges and mutually damage one another (chipping).

It is therefore the object of the present invention to provide a method of the initially mentioned type with which the post-tensioning of the carrier foil is no longer effected directly in the processing plane and with which also large wafer diameters may be handled without danger or damage to the chips. Furthermore overall there is to be achieved a higher flexibility on the manufacture between the process steps of the manufacture of the wafers and the processing of the chips.

According to the invention this object is achieved with a method which comprises the features of claim 1. The fastening of the foil frame on a quasi overriding adapter frame and the post-tensioning of the carrier foil which occurs with this firstly has the effect that the post-tensioning process does not need to be effected firstly on the processing table, but may be effected at any earlier point in time. On account of the flow behaviour of the carrier foil this tends to post-stretch after the actual tensioning procedure. Since the post-tensioning procedure in the adapter frame takes place long before the actual processing process the post-stretching process is completed on reaching the treatment table.

With an intermediate storage or a mechanised transport no damage may occur any more as a result of sagging. The required process steps are carried out on the adapter frame in the resprospectively tensioned condition. The treatment machine need only accommodate standardised adapter frames and no more foil frames of differing dimensions. Furthermore after the working off of a subject a longer machine interruption is no longer required, since in each case a second adapter frame may be loaded which is immediately available for application at the processing station.

The abutting means serves as an interface for positioning the adapter frame in the process step in a horizontal or vertical or any other working plane. This standardised interface makes easier the handling with each working process.

The subject, on the adapter frame, may be sawn into individual parts, for example into individual chips, in a saw device. In this manner already on sawing or directly after the cut a damage to the subject is avoided. The post-tensioning of the carrier foil may be effected before or after the sawing. With this it is merely important that the foil frame in the adapter frame is sufficiently fixed before the post-tensioning. The subject subdivided into several individual parts may be held on the adapter frame but also in an equipping device on a receiving table in a receiving plane in which in a cycled manner individual parts are released from the carrier foil and are again deposited in a dispensing plane.

The method may be carried out particularly advantageously when the carrier foil on the adapter frame, by way of a clamping ring engaging on the foil frame, is tensioned on a base ring over a circumferential tensioning edge between the subject and foil frame, until a predetermined tensioning force or a predetermined position is achieved and when subsequently the clamping ring is latched with the base ring. The tensioning procedure may with this be largely automated.

For this purpose the base ring may be placed on a lifting device and after the placing of a foil frame onto the tensioning edge may be pressed for latching against the relatively stationary clamping ring. The closing or latching of the adapter frame may be effected in the treatment machine, thus for example in a saw device or in an equipping device.

The invention also relates to a device for the post-tensioning of a carrier foil for a two-dimensional subject, in particular for a semiconductor wafer, which is tensioned over a foil frame, with the features according to claim 6. The stretching of the carrier foil between a base ring and a clamping ring with the help of a tensioning means effects a uniform stretching of the carrier foil towards the outer side. The tensioning over the tensioning edge at the same time is effected relatively slowly, which has an advantageous effect with respect to the post-stretching of the plastic foil. The base ring and the clamping ring together form an adapter frame which may also accommodate foil frames of differing sizes or differing configurations. The abutting means on the adapter frame permit a tensioning in any treatment device independently of the construction of the foil frame.

The base ring may at the same time comprise a bearing shoulder for the foil frame, which is adjustable relative to the plane. In this manner the desired tensioning force on the carrier foil may be particularly easily set. The abutting shoulder may at the same time be formed by a threaded ring which is screwed onto a neck section provided with an outer thread. Also with relatively large diameters in this manner a fine and jam-free adjustment is easily possible. The bearing shoulder could however also be formed by a slider ring which is fastened on the base ring by way of clamping screws. Also a motoric adjustment of the bearing shoulder would be conceivable, which would make possible a fully automatic movement to a predetermined position.

As a tensioning means advantageously there are arranged several latching elements which are distributed over the circumference of the adapter frame and on which the clamping ring and the base ring may be latched with one another under spring pretensioning. The spring force ensures that the tension on the carrier foil is maintained. The latching elements may be closed by pressure.

It has been proved to be particularly advantageous when the latching elements comprise at least one leaf spring running roughly in the plane of the tensioning edge, and at least in each case one tensioning hook which is preferably able to be deflected out and which can be latched over the end of the leaf spring. With this the leaf spring and the tensioning hook on latching are slightly deflected out. The tensioning hook may at the same time for example be mounted in a jointed manner so that in the latched-in condition it is held in the latching-in position by way of the force of the leaf spring, whilst after the unloading it may be pivoted out. With this the pivoting into the latching position could be effected by way of magnetic means.

The leaf springs are preferably arranged on the threaded ring. In this manner the relative distance between the tensioning hook and the leaf spring is always roughly of the same magnitude, independently of the selected adjustment of the threaded ring.

A uniform distribution of four latching elements on the adapter frame at an angular separation of 90° has shown to be particularly advantageous. According to the dimension of the applied foil frame also however another number or other distribution of the latching elements may be selected. This is particularly the case when the foil frame is not formed annulus-shaped.

In order to continuously ensure a constant and precise meeting of the latching elements on the adapter frame there is arranged at least one positioning element for the mutual positioning of the clamping ring and the base ring. As abutting means for fastening the adapter frame in a treatment device the base ring may comprise a reference surface and at least one guiding and/or positioning means such as e.g. a laterally arranged positioning claw. With this the reference surface permits an exact alignment of the carrier foil onto a predetermined treatment plane and the positioning claws permit a fastening of the adapter frame to the exact angle. In order to lengthen the life expectancy of the adapter frame or to reduce the wear or also for reasons of manufacturing technology the reference surface and the guiding and/or positioning means may be formed by an insert which consists of another, e.g. more wear resistant material than the remaining base ring. An insert of steel, of hard metal or of ceramic material would be conceivable.

Finally the invention relates also to a device for the treatment of a two-dimensional subject, in particular a semiconductor wafer, according to the preamble of claim 16. Such devices for sawing, sorting or equipping as a rule function as fully or semi automatic machines. A prepared foil frame with a subject placed thereon is removed from a magazine and by way of transport means is supplied to a receiving table for firmly holding the subject in the active region of a working station. The device according to the invention is characterised by the features in claim 16.

By way of a simple exchange of the adapter frame in a particularly simple manner differing sizes of foil frames may be processed.

The transport means contains with this at least in parts a loading and tensioning device on which a foil frame is loaded into an adapter frame and its carrier foil is post-tensioned in the adapter frame. This transport means thus evidently fullfills two various functions, in that it handles the adapter frame or post-tensions the foil and simultaneously supplies the adapter frame at least over a part of the path distance to the working table. The post-tensioning of the carrier foil is thus no longer effected as previously on the receiving table itself, but in another region of the machine. In spite of this the tensioning procedure is carried out automatically.

The treatment device advantageously has at its disposal an insertion device for inserting an empty adapter frame into the loading and tensioning device. An operating person thus merely needs to apply an adapter frame into the insertion device, wherein the exact placing in the loading and tensioning device is effected automatically. The loading and tensioning device advantageously comprises a lifting table which is displaceable against a clamping ring receiver from a loading position into a tensioning position, wherein the lifting table carries the base ring and the clamping ring receiver the clamping ring of an adapter frame, and wherein in the tensioning position the adapter frame is tensioned together. The lifting table thus has the task of exerting the tensioning force for closing the adapter frame or of covering the corresponding path. After tensioning together the adapter frame this is then only held firmly by the clamping ring receiver.

Advantageously the lifting table is formed such that it may also directly lift an empty adapter frame from the insertion device. For this purpose it may be lowered into a transfer position in which it lies below the plane of the insertion device. The magazine is height-adjustably arranged next to the lifting table, wherein for the planar-parallel transfer of a foil frame from a magazine compartment onto a base ring lying on a table there is provided an extractor. The magazine is in each case adjusted such that the foil frame to be removed lies on the correct plane. For inserting the insertion device the magazine may be lifted completely.

For reasons of machine technology the lifting table and receiving table in certain cases do not lie in the same plane. It is therefore advantageous when the clamping ring receiver with the adapter frame tensioned together is displaceable and/or pivotable out of the plane of the lifting table into the plane of the receiving table. The clamping ring receiver may with this for example execute a pivoting movement of 90° from a horizontal into a vertical plane. Any yet remaining path between the clamping ring receiver and the receiving table may be covered by an end transport device, in particular with a lift for transporting an adapter frame to the receiving table. Of course it would however also be conceivable that the whole clamping ring receiver is formed as a displaceable unit.

A particularly rational working manner may be achieved with the device when the transport means in a region between the loading and tensioning device and the receiving table comprises receiving means for receiving at least two adapter frames so that the loaded adapter frame may be prepared in a parking position. In this manner in each case a foil frame may be worked off in a first adapter frame, whilst another foil frame is loaded and tensioned in a second adapter frame. The machine functions therefore continuously with at least two adapter frames and after the working off of a foil frame it must not be stopped on the receiving table until the foil frame is pushed back into the magazine and the new foil frame is tensioned in the adapter frame. Rather a quicker exchange at the receiving table is possible because continuously there is made available a loaded adapter frame.

Figure 2:
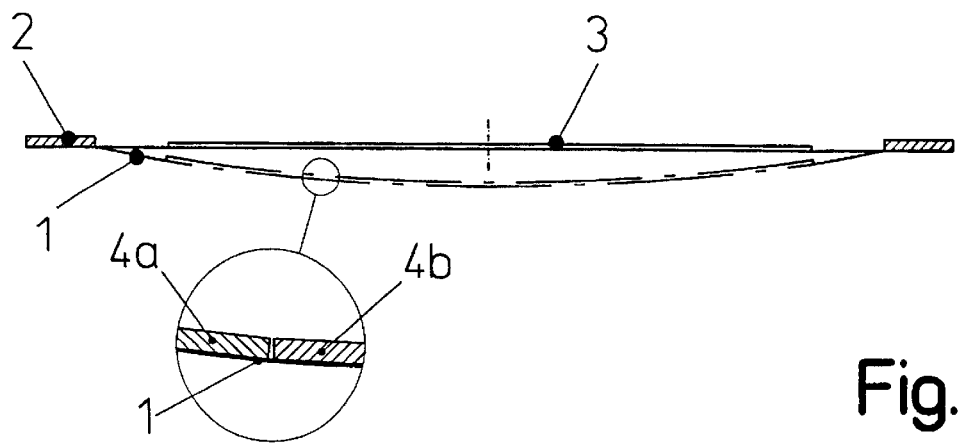
Figure 3:
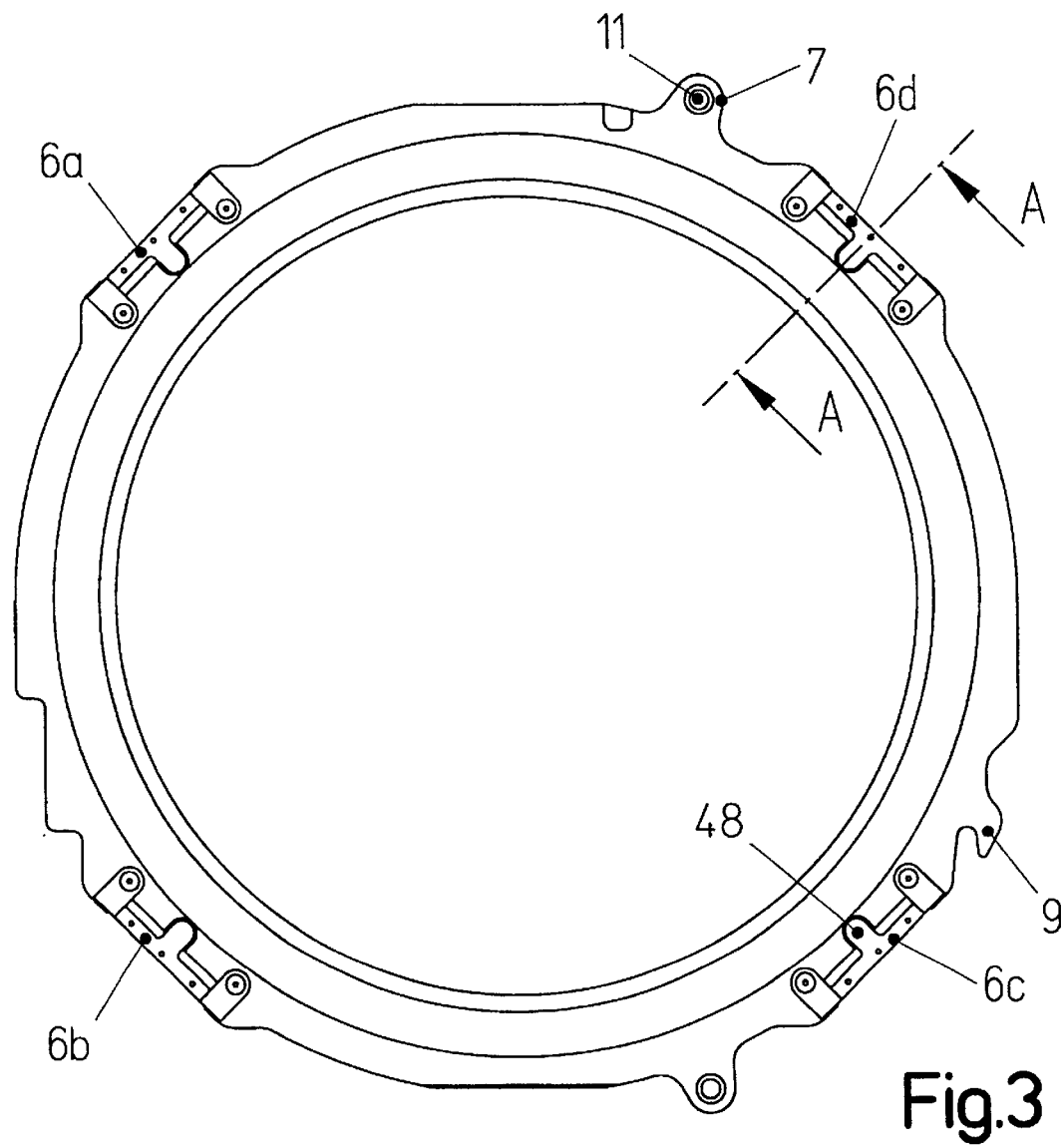
Figure 4:
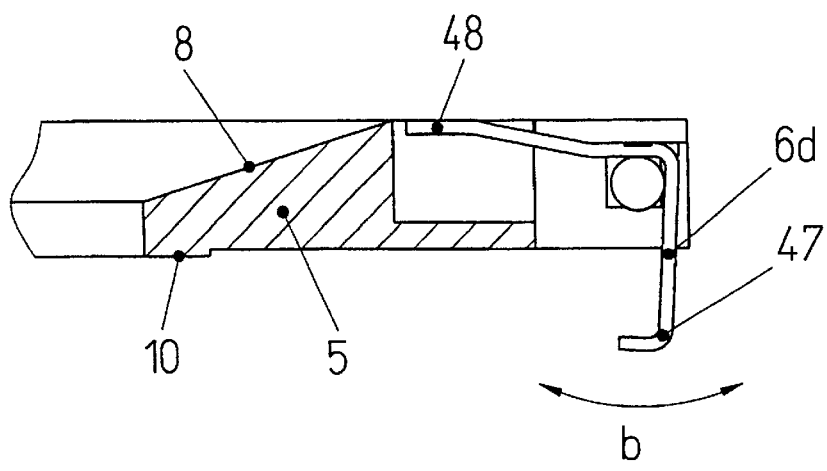
Figure 5:
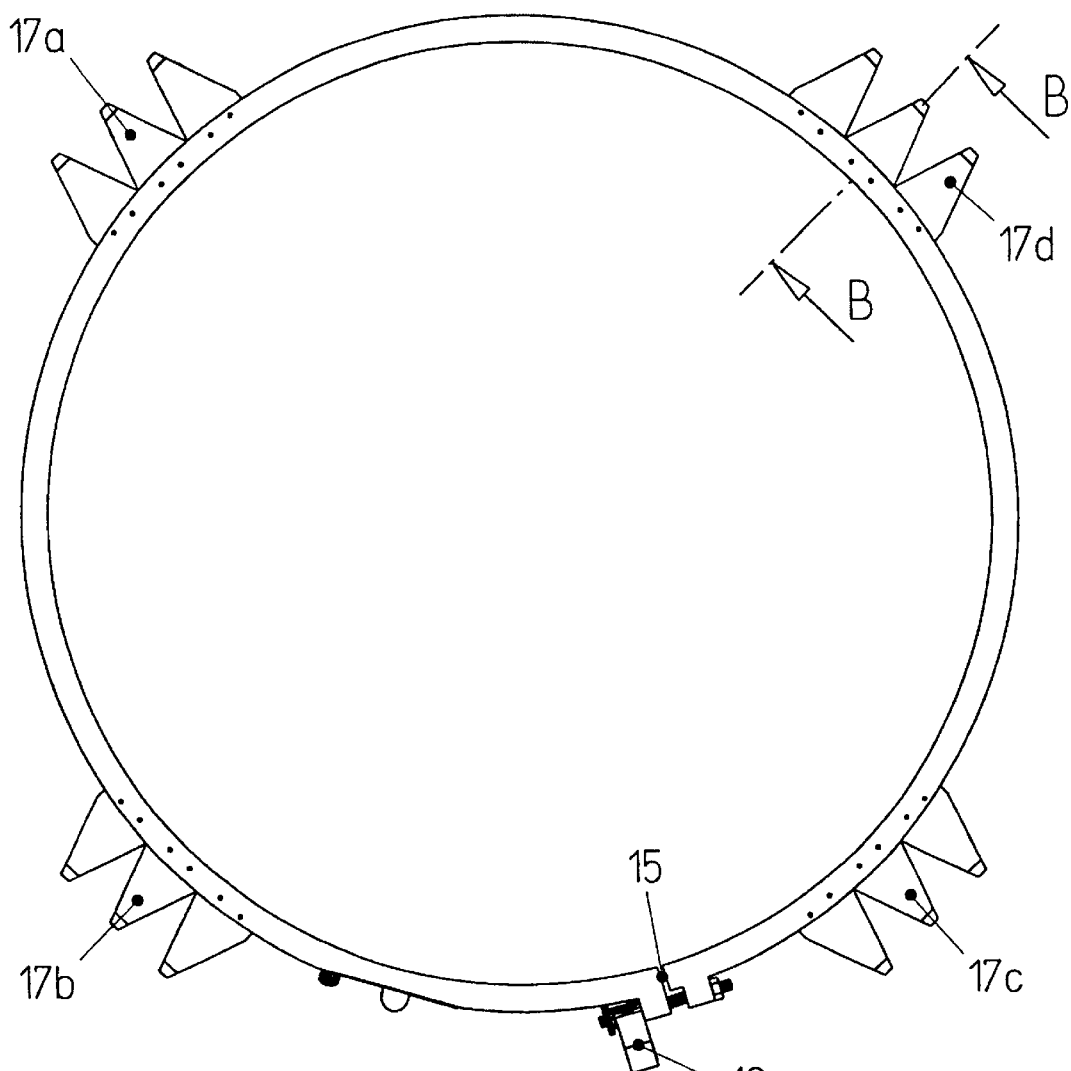
Figure 6:
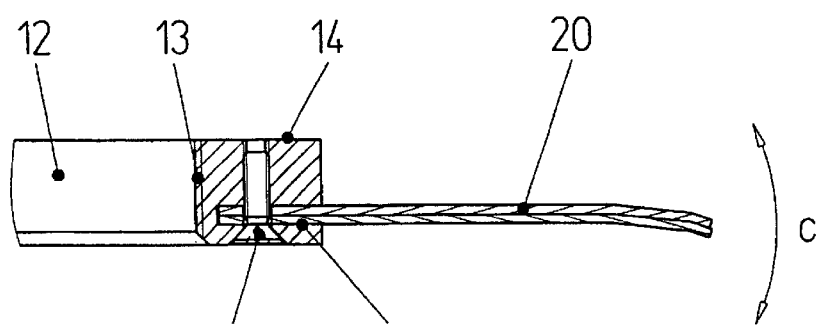
Figure 7:
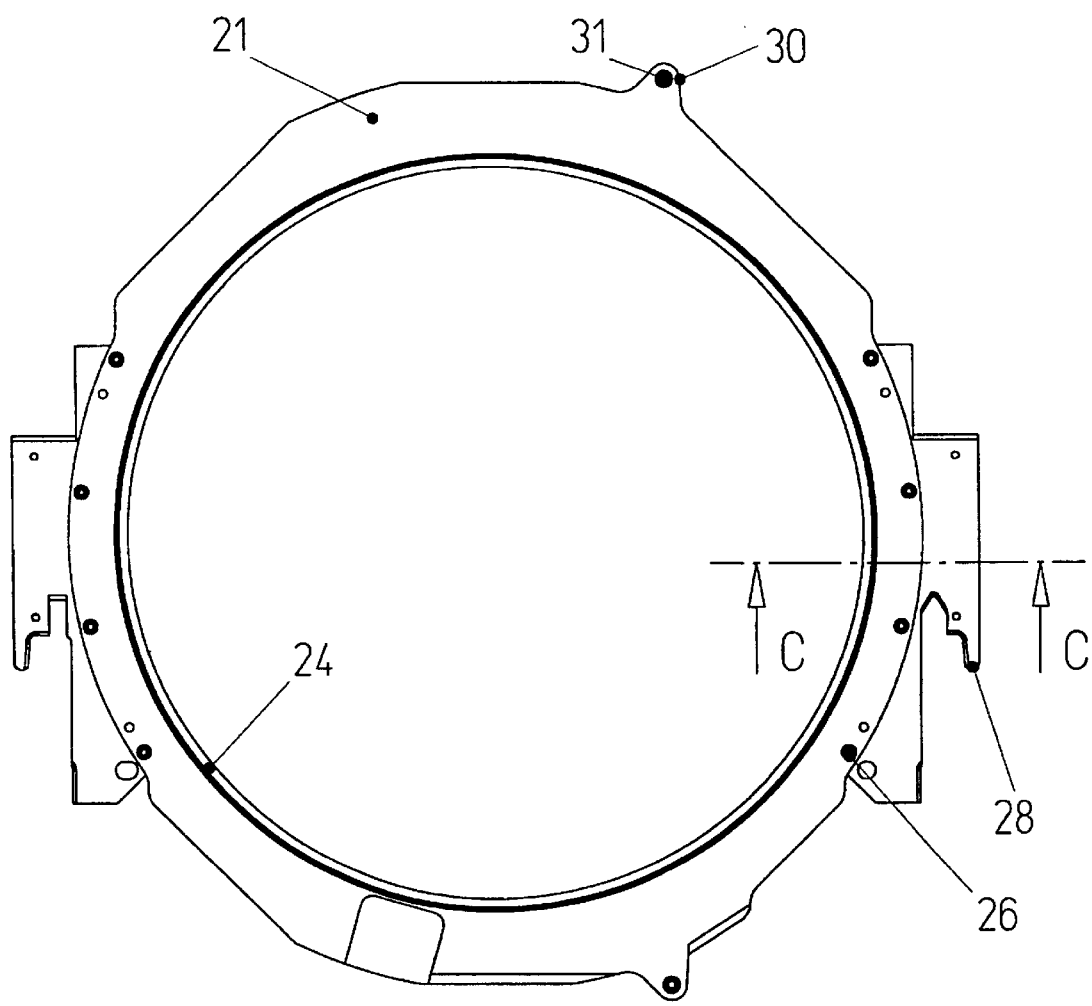
Figure 8:
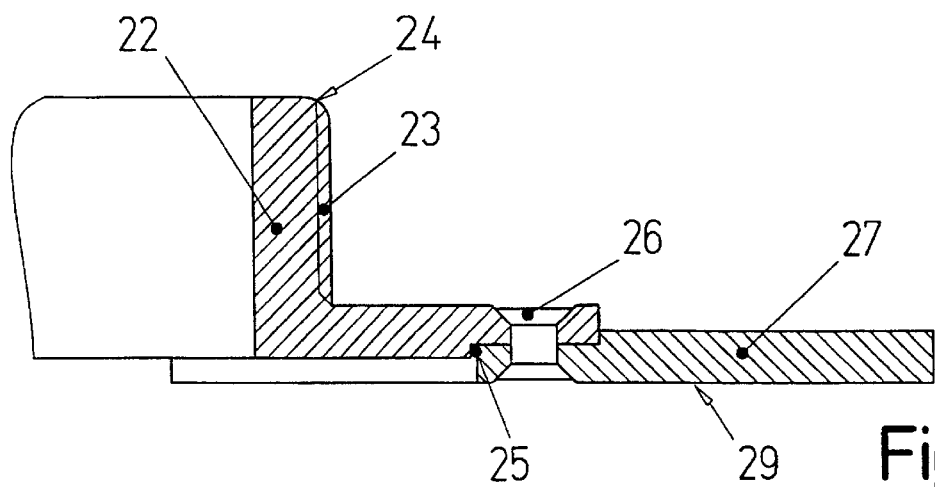
Figure 9:
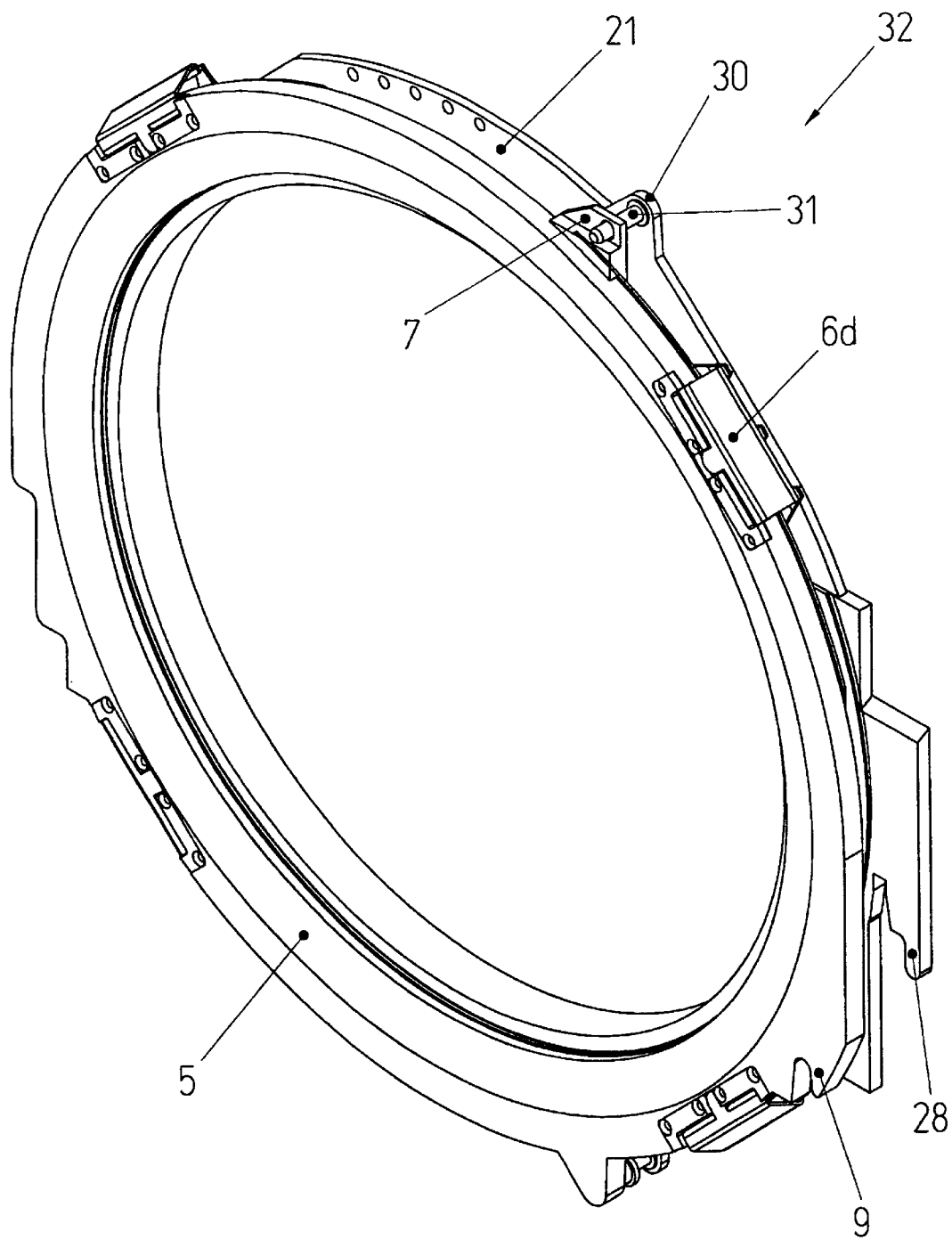
Figure 10:
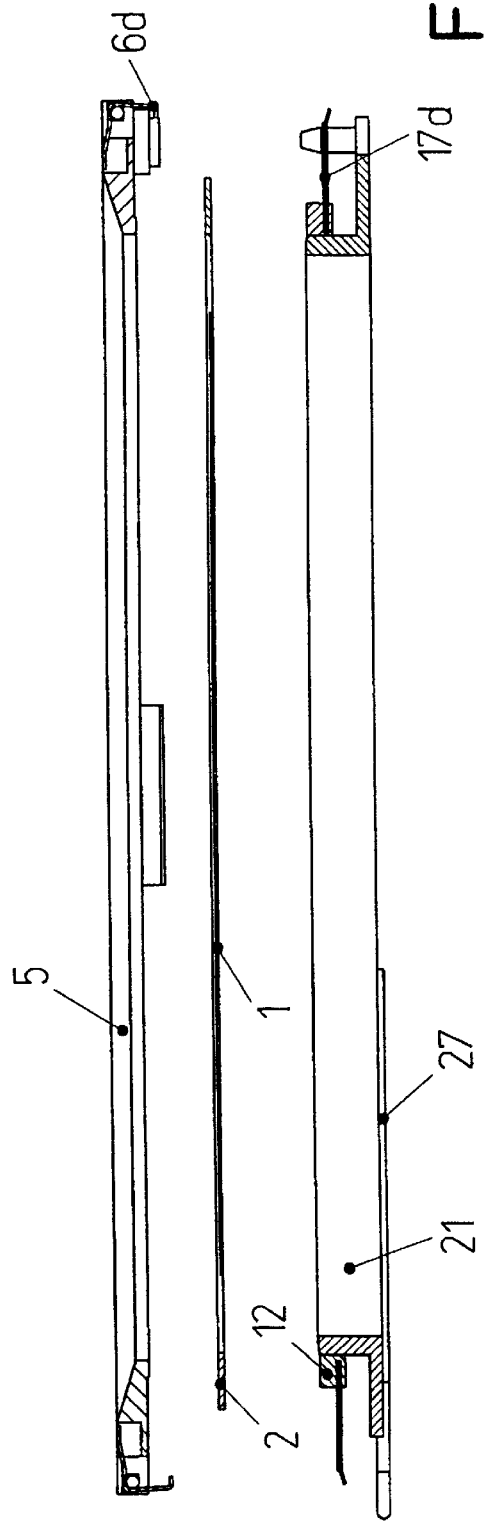
Figure 11:
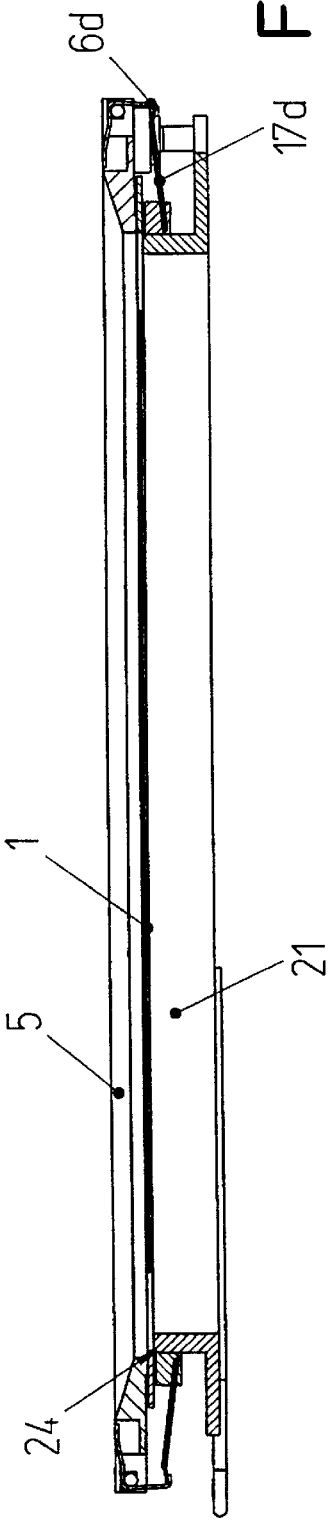
Figure 12:
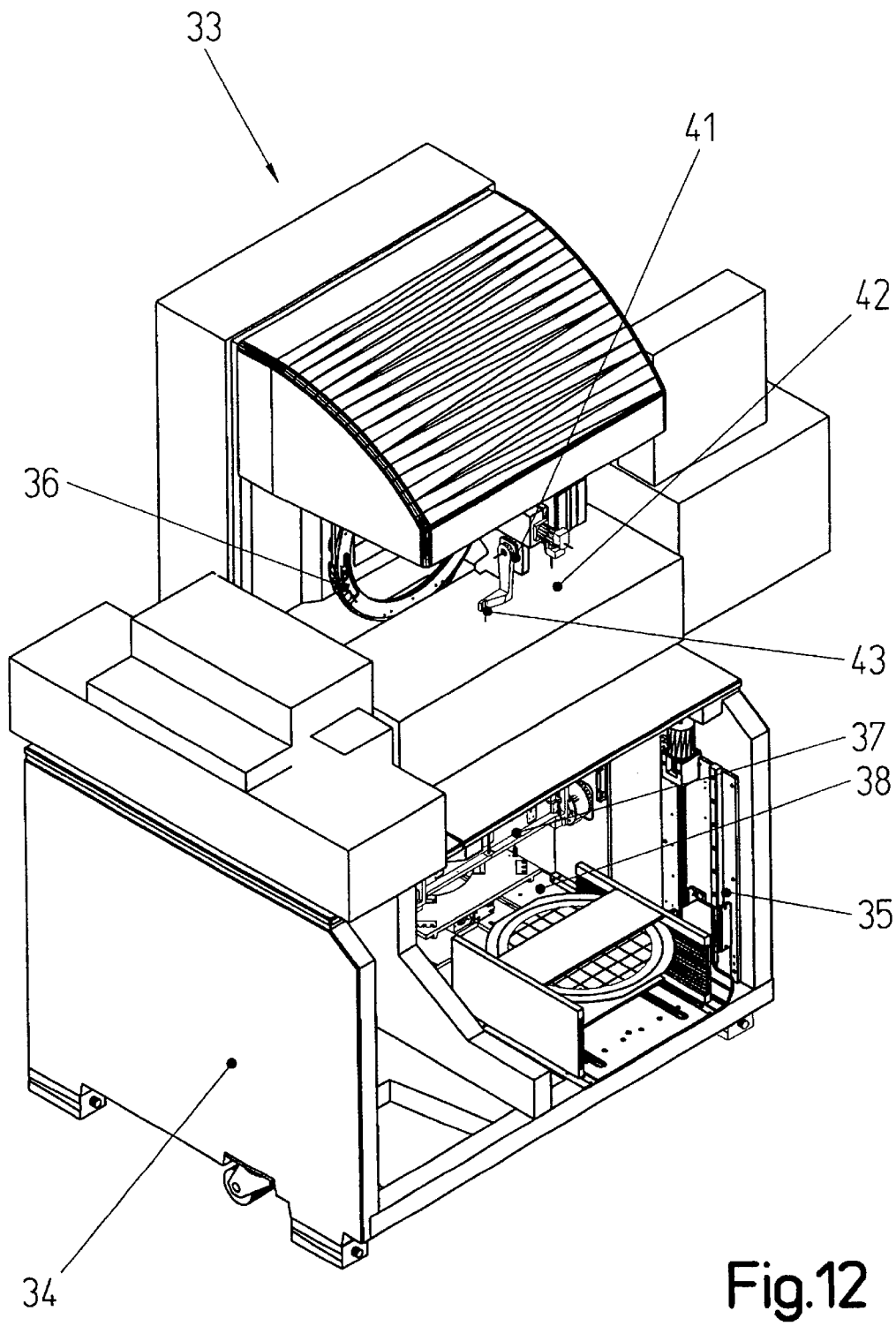
Figure 13:
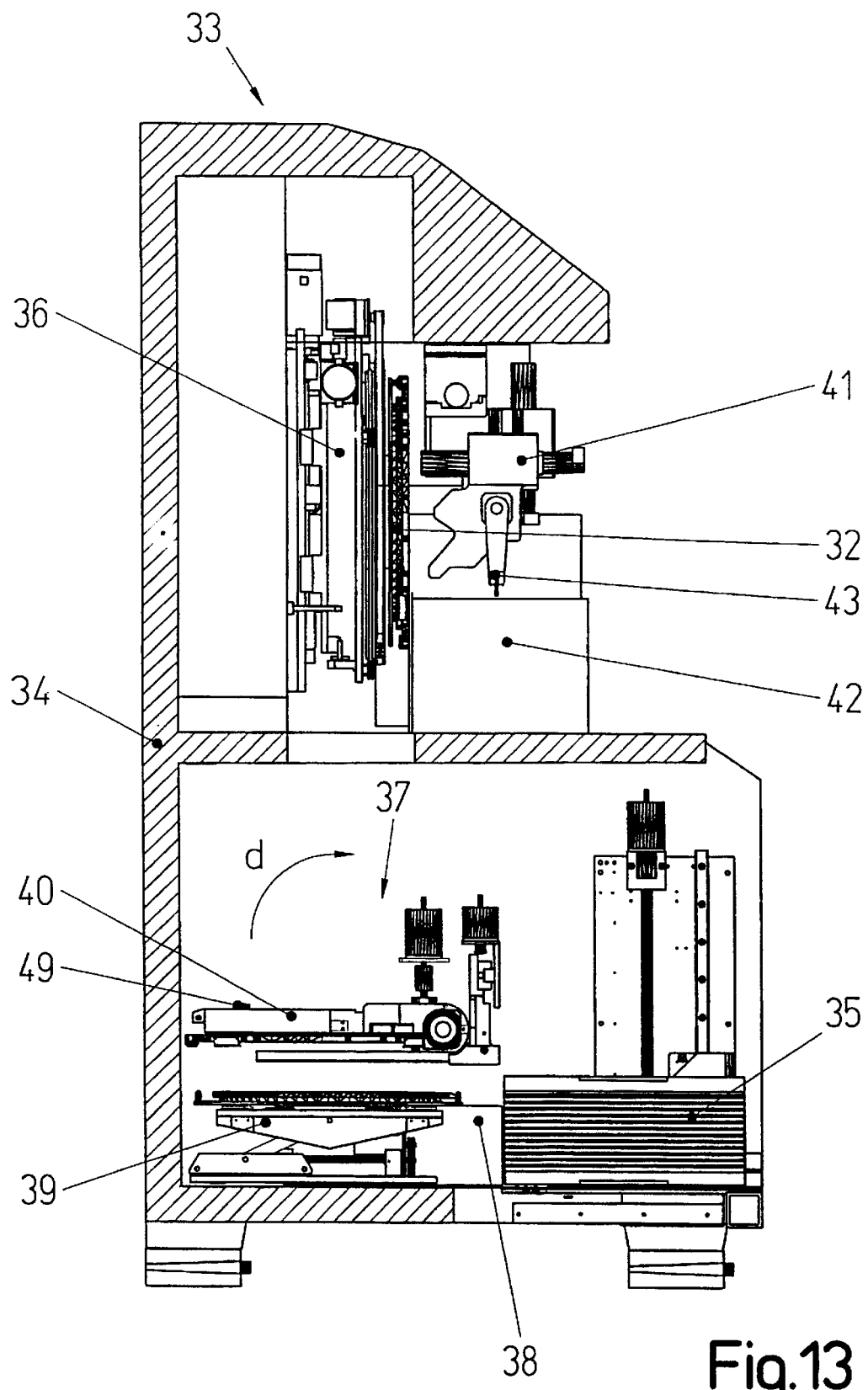

Further individual features and advantages of the invention result from the drawings and from the subsequently described embodiment example. There are shown:

FIG. 1 a plan view of the foil frame with an adhesed and already sawn wafer,

FIG. 2 a cross section through the foil frame according to FIG. 1,

FIG. 3 a plan view of a clamping ring,

FIG. 4 a cross section through the clamping ring according to FIG. 3 in the plane A—A in an enlarged view, FIG. 5 a plan view of a threaded ring, FIG. 6 a plan view through the threaded ring according to FIG. 5 in the plane B—B in an enlarged scale, FIG. 7 a plan view of a base ring, FIG. 8 a cross section through the base ring according to FIG. 7 in an enlarged scale, FIG. 9 a perspective representation of a tensioned adapter frame without a foil frame, FIG. 10 a cross section through an opened adapter frame before the tensioning of a foil frame, FIG. 11 the adapter frame according to FIG. 10 after the latching, FIG. 12 a perspective representation of an equipping automatic machine, FIG. 13 a cross section through the equipping automatic machine according to FIG. 12, FIGS. 14 to 16 a loading procedure of an adapter frame in schematic representations, and FIGS. 17 and 18 the crossing of two adapter frames in schematic representations.

FIG. 1 shows a foil frame 2 known per se which is skinned by a carrier foil 1 of elastic plastic material. On the carrier foil there is adhesed a semiconductor wafer 3 which is already sawn so that the individual chips 4 are separated from one another. For the removal of these chips in the equipping automatic machine the carrier foil 1 must be expanded in the direction of arrow a so that the intermediate spaces between the chips enlarge. The foil frame 2 consists preferably of metal and at its circumferential region is provided with reliefs and flattenings in order for example to position it in a magazine.

From the cross section according to FIG. 2 it can be seen that according to the diameter of the foil frame 2 there may enter a foil sagging indicated by dot-dash lines. The already subdivided wafer follows this sagging, wherein individual chips 4a and 4b may abut on one another with their upper edges. By way of acceleration or deceleration manoeuvres with the handling of the foil frame in an automatic machine this sagging with this may yet be heavily increased. The sagging may only be prevented with a post-tensioning of the carrier foil within the foil frame which is possible with a subsequently described adapter frame.

The previously described adapter frame consists essentially of a clamping ring and of a base ring, wherein the base ring as an adjustable bearing shoulder is provided with a threaded ring. These three components and their function are hereinafter desribed in more detail by way of the FIGS. 3 and 8.

The clamping ring 5 according to the FIGS. 3 and 4 is formed essentially annulus-shaped, wherein on the outer circumference likewise abutting means 9 for positioning the clamping ring in a clamping ring receiver are provided. Distributed on the outer circumference, with an angular separation of 90° are four tensioning hooks 6a, 6b. These are formed as angular levers and are fastened in a manner such that the hook end 47 may resiliently pivot out in the arrow direction b. A lever arm 48 bent at 90° is e.g. actuated by an electro-magnet 49 in the clamping ring receiver 40 (FIG. 13) by which means the tensioning hooks may be opened. In the closed position they are held by way of spring force. It would however also be conceivable to rigidly clamp the tensioning hooks, but to form them resiliently so that by way of tension or pressure they latch in and out themselves. For the angular positioning with the base ring a positioning lug 7 with an opening 11 is arranged on the outer circumference.

On its upper-lying inner side the clamping ring 5 is provided with a bevelling 8 which tapers the wall thickness towards the centre. This bevelling permits a travel of the foil surface with a pick-up pivoting arm also to the most extreme edge regions of the carrier foil. The lower side of the clamping ring is formed as a plane tensioning surface 10 which is envisaged for pressing down the foil frame 2.

The described clamping ring 5 is latched together with a threaded ring 12 according to FIGS. 5 and 6. The latter has an inner thread 13 at its disposal for screwing onto a base ring. The threaded ring is however not formed closed, but may be provided with a slot 15 so that it may be locked on the base ring in the desired screwed-on position with a securement closure 16. The surface of the threaded ring is formed as a plane resting surface 14 for the foil frame.

In the same angular separation as the tensioning hooks on the clamping ring on the threaded ring there are fastened spring assemblies 17a, 17b, 17c, 17d. These as a rule consist of several individual leaf springs 20 with a preferably triangular base shape. The leaf springs are fixed in a slot 18 by way of countersunk screws 19 on the threaded ring. In order to ensure that the threaded ring with the securement closure 16 is always locked at a correct angular position there may be provided a marking which cooperates with a marking on the base ring. On latching in or out the ends of the leaf springs 20 moves in the direction of arrow c. The outermost end of the leaf springs is inclined slightly downwards in order to ensure a secure suspension in the tensioned condition.

The base ring 21 according to FIGS. 7 and 8 is formed essentially likewise annular-shaped. It has a neck section 22 which is provided with an outer thread 23 for screwing on the threaded ring 12. The upper end of the neck section at the same time forms the tensioning edge 24 over which the carrier foil is tensioned. The tensioning edge is always also the working plane on the foil, independently of which position the threaded ring is locked. On the base ring a type coding may be provided so that the machine recognises the type of used base rings.

The interface or the abutment means for fastening the adapter frame on a receiver table are arranged on the base ring 21. Since with this it is a case of parts which are subjected to a particularly high loading they advantageously consist of a harder metal than the remaining base ring. For this purpose on the lower side of the base ring there is provided a groove 25 which accomodates with an insert 27. The fastening of the insert is effected for example via countersunk rivets 26. The insert 27 is provided with a reference surface 29 having an exact size and comprises lateral positioning lugs 28 on which the whole adapter frame can be positioned and fastened.

For the relative positioning with respect to the clamping ring there is provided a positioning lug 30 which carries a pin 31. This penetrates into the opening 11 on the positioning lug 7 of the clamping ring. With this it is simultaneously ensured that with on processing the clamping ring may not rotate or displace relative to the base ring.

FIG. 9 shows an adapter frame 32 tensioned together, wherein the threaded ring is however not visible. However clearly recognisable is the relative positioning between the clamping ring 5 and the base ring 21 at the positioning lugs 7 and 30. The FIGS. 10 and 11 show the adapter frame before and after the latching. A foil frame 2 is with this centrically layed onto the base ring 21 in a manner such that the tensioning edge 24 supports the carrier foil 1 outside of the subject. By way of a relative pushing together of the clamping ring and base ring the foil frame 2 is pressed down from the plane of that the tensioning edge 24 onto the threaded ring 12. After the latching of the tensioning hook into the spring assemblies the tensioning force is maintained by the leaf springs. The thickness of the foil frame 2 with this does not need to be taken into account since the foil extension is defined by the relative position of the threaded ring.

FIG. 12 shows as a whole an equipping automatic machine 13 (die bonder) with whose help chips are removed from a wafer and can be fastened on a substrate, for example on a circuit board. The equipping automatic machine has a machine frame 34 in whose lower region there is arranged a loading and tensioning device 37 for loading and tensioning the described adapter frame 32.

With an insertion device 38 empty adapter frames may be supplied to the machine. In a magazine 35 several foil frames are made available.

In the upper part of the machine frame 34 in a vertical plane there is arranged a rotatable receiving table 36 on which the loaded adapter frames are fastened. A transfer unit 41 is provided with a pickup 43 which may transfer individual chips from the plane of the receiving table 36 into the plane of a dispensing table 42.

From FIG. 13 further details of the loading and tensioning device 37 can be seen. This has a lifting table 39 and clamping ring receiver 40 over the lifting table. The lifting table has a scissor frame and on the one side may be pressed against the relatively stationary clamping receiver 40. The lifting table with this carries a base ring whilst the clamping ring is fastened on the clamping ring receiver 40 and held in planar-parallel manner. After reaching the corresponding position a latching of the clamping ring and the base ring takes place and the lifting table is lowered again. The loaded and tensioned adapter frame is then exclusively held on the clamping ring receiver 10.

The resting surface of the lifting table 39 is equipped with sensorics which determines whether the springs are latched in.

The lifting table 39 may be lowered from its loading plane but may also be completely lowered. This position is then assumed when with the insertion device 38 an adapter frame is introduced into the machine. The adapter frame may then be lifted directly out of the insertion device by raising the lifting table and for opening be driven against the clamping ring receiver 40.

The magazine 35, with several magazine commpartments lying over one another for receiving foil frames, is arranged in front of the loading and tensioning device 37 in a height-adjustable manner. In each case it is adjusted in a manner such that a filled magazine compartment lies roughly on the plane of the lifting table 39. A foil frame is then pulled out of the magazine compartment with the help of a special extractor 44 and layed in the correct position on the lifting table. For positioning the foil frame onto the lifting table a special positioning device may be provided.

The clamping ring receiver 40 may be pivoted up in the direction of arrow d about 90° in a vertical plane. This pivoted up position is to be recognised in the FIGS. 17 and 18. From the vertical position an adapter frame 32 may be transported to the receiving table 36 with a lift 45 and here fastened in the correct position.

So that between the loading and the tensioning device 37 and the receiving 36 a crossing of two adapter frames 32 is possible, these may be driven into a parking position. For this purpose there is provided an exchange mounting 46 which is traversable from a transfer position from the pivoted up clamping ring receiver 40 into a parking position which is displaced planar-parallel thereto. As is evident this permits two adapter frames to be able cross in a planar-parallel manner, wherein in each case one of the adapter frames remains in the parking position whilst the other adapter frame is removed from the receiving table or led to the receiving table. The preparation of loaded adapter frames may also be solved in other ways, e.g. by way of a carousel on which in one plane several adapter frames may be accommodated and which functions in the manner of a CD exchange.

The supply of a foil frame from the magazine 35 to the receiving table 36 is subsequently described once again by schematic figures. With this it is presupposed that the machine is already equipped with the required adapter frame.

Figure 14:
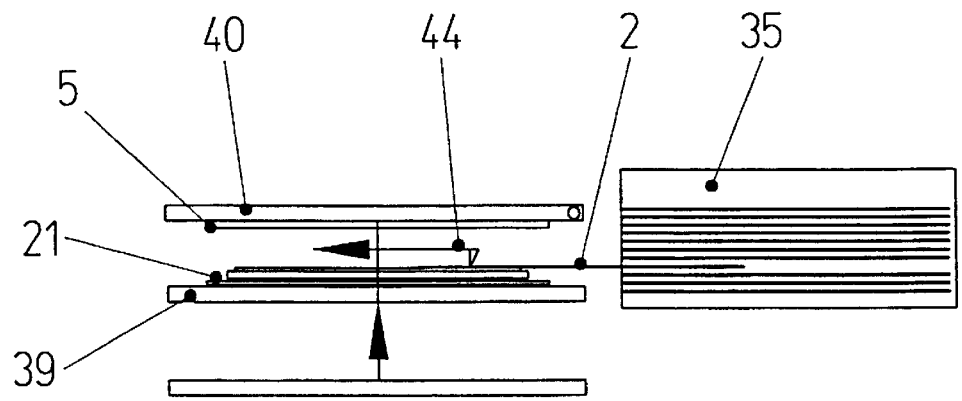

According to FIG. 14 with the extractor 44 a foil frame 2 is pulled from the magazine 35 and transferred to a base ring 21 which lies on the lifting table 39. On the clamping ring receiver 40 there is fastened a clamping ring 5.

Subsequently the lifting table 39 is driven against the clamping ring receiver 40, as is deduced from FIG. 15. On reaching the corresponding latching position the latching between the clamping ring and base ring takes place, wherein the foil on the foil frame 2 is post-tensioned.

Figures 15, 16:
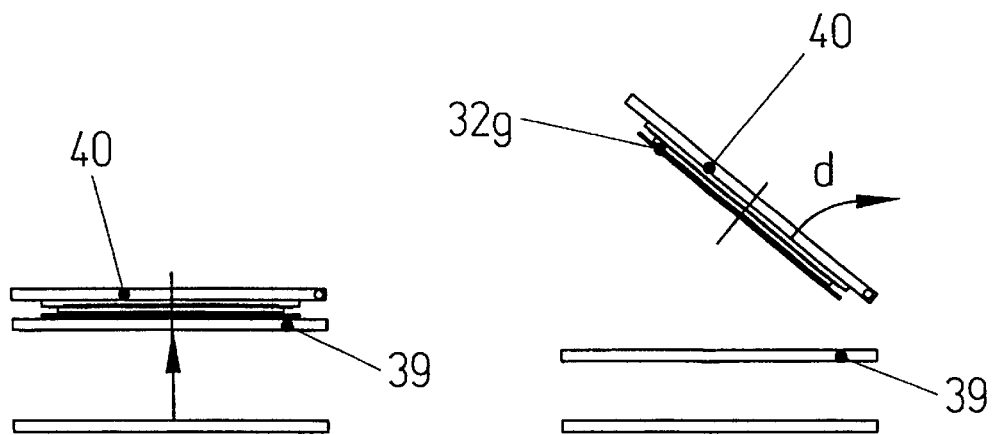

According to FIG. 16 the clamping ring receiver 40 with the loaded adapter frame 32g is pivoted up in the direction of arrow d.

According to FIG. 17 the adapter frame 32g in the pivoted-up position is acquired by an exchange mounting 46 which is driven onto the clamping ring receiver 40. The exchange mounting 46 has a second receiving location for an empty adapter frame 321, whose subjects are processed or removed on the receiving table 36. This adapter frame 321 is now transported with the lift 45 from the receiving table 36 to the exchange mounting 46.

As soon as both adapter frames are accommodated in the exchange mounting 46 the latter is driven away from the clamping ring receiver 40 in a planar-parallel manner into a parking position as can be seen from FIG. 18. In this parking position the loaded adapter frame 32g may be raised with the lift and transported to the receiving table 36, whilst the adapter frame 321 waits in the parking position. Subsequently the exchange mounting 46 is again driven so far against the clamping ring receiver 40 that this may accommodate the adapter frames 321. The clamping ring receiver 40 then pivots with its empty adapter frame 321 back into the plane of the lifting table 39, the adapter frame 321 is opened and the used foil frame is removed. The loading and tensioning device is then ready for takeover of a new foil frame from the magazine.

What is claimed is:

1. A method for treating a semiconductor wafer, adhered on a carrier foil tensioned over a foil frame and which up to its complete or partial release from the carrier foil passes through at least one processing step, said method comprising steps of fastening the foil frame on an adapter frame comprising at least one abutment means, post-tensioning the carrier foil on the adapter frame, positioning the adapter frame in a processing machine by means of the abutment means, and processing the wafer while it is supported on the adapter frame on said post-tensioned carrier foil.

2. A method according to claim 1, comprising a further step of sawing said wafer into individual parts.

3. A method according to claim 1, comprising a further step of subdividing the wafer into individual parts, holding the parts on a receiving plane, and then releasing individual ones of said parts from the carrier foil and depositing them onto the dispensing plane.

4. A method according to claim 1, wherein the foil is tensioned by drawing the foil frame over a circumferential tensioning edge of a base ring between the wafer and the foil frame until a predetermined tensioning force is reached, and then latching a clamping ring to the base ring.

5. A method according to claim 4, wherein the base ring is placed on a lifting device, a foil frame is then laid onto the tensioning edge, and the base ring is then latched against the clamping ring.

6. A device for post-tensioning a carrier foil for a semiconductor wafer, which foil has been pre-tensioned over a foil frame, said device comprising a base ring having a circumferential tensioning edge between the semionductor wafer and the foil frame, a clamping ring engaging the foil frame, and tensioning means for pressing the base ring and the clamping ring against one another, thereby tensioning the carrier foil lying between the base ring and clamping ring over the tensioning edge, wherein the device forms an adapter frame having abutment means for positioning the adapter frame in a processing apparatus.

7. A device according to claim 6, wherein the base ring comprises a resting shoulder for the foil frame, said shoulder being adjustable relative to a plane defined by said tensioning edge.

8. A device according to claim 7, wherein the bearing shoulder is formed by an internally threaded ring which is screwed onto an externally threaded neck section on the base ring.

9. A device according to claim 6, wherein the tensioning means further comprises a plurality of latching elements spaced around a circumference of the adapter frame, on which the clamping ring and the base ring can be latched to one another under spring pretensioning.

10. A device according to claim 9, wherein each said latching element comprises a leaf spring lying substantially in a plane of the tensioning edge, and a deflectable hook adapted to engage an end of the leaf spring.

11. A device according to claim 10, wherein said leaf springs are disposed on the threaded ring, and the hooks are disposed on the clamping ring.

12. A device according to claim 10, wherein four said latches are disposed at a circumferential spacing of about 90°.

13. A device according to claim 12, further comprising a positioning element on the adapter frame for positioning the clamping ring with respect to the base ring.

14. A device according to claim 13, wherein the base ring comprises a reference surface providing an abutment means, and at least one positioning means.

15. A device according to claim 14, wherein the reference surface and the positioning means are formed by an insert of a material different from that of the base ring.

16. A device according to claim 6, further comprising a magazine for preparing several foil frames each supporting a respective semiconductor wafer adhered thereto, a receiving table for firmly holding the wafer in a work station, and means for transporting the foil frame from the magazine to the receiving table, wherein the transporting means at least partly contains a loading and tensioning device on which a foil frame is loaded into an adapter frame and its carrier foil is post-tensioned in the adapter frame.

17. A device according to claim 16, wherein the transport means comprises means for receiving at least two adapter frames whereby a loaded adapter frame may be prepared in a parked position.

18. A device for post-tensioning a carrier foil for a semiconductor wafer, which foil has been pre-tensioned over a foil frame, said device comprising a base ring having a circumferential tensioning edge between the wafer and the foil frame, a clamping ring engaging the foil frame, wherein the base ring comprises a reference surface providing an abutment means, and at least one positioning means and tensioning means for pressing the base ring and the clamping ring against one another, thereby tensioning the carrier foil lying between the base ring and clamping ring over the tensioning edge.

* * * * *